United States Patent [19]
Willis et al.

[11] Patent Number: 5,796,274
[45] Date of Patent: Aug. 18, 1998

[54] FAULT TOLERANT MOSFET DRIVER

[75] Inventors: Scott C. Willis, Manassas; Mark J. Jones, Centreville, both of Va.

[73] Assignee: Lockheed Martin Corporation, Bethesda, Md.

[21] Appl. No.: 733,080

[22] Filed: Oct. 16, 1996

[51] Int. Cl.⁶ .................................................. H03K 5/22
[52] U.S. Cl. ........................... 327/63; 327/404; 327/408; 307/44; 307/65
[58] Field of Search ........................... 307/43, 44, 64, 307/65, 66, 85; 327/63, 64, 65, 66, 67, 68, 69, 70, 71, 403, 404, 407, 408, 436

[56] References Cited

U.S. PATENT DOCUMENTS

| | | |
|---|---|---|
| 4,617,473 | 10/1986 | Bingham ............................ 327/63 |
| 4,638,175 | 1/1987 | Bradford et al. |
| 4,639,614 | 1/1987 | Basile |
| 4,672,246 | 6/1987 | Donovan |
| 4,806,789 | 2/1989 | Sakihama et al. .................. 327/63 |
| 4,812,672 | 3/1989 | Cowan et al. |
| 5,157,291 | 10/1992 | Shimoda ............................. 327/408 |
| 5,272,393 | 12/1993 | Horiguchi et al. ................. 327/63 |
| 5,426,386 | 6/1995 | Matthews et al. ................. 327/63 |
| 5,583,384 | 12/1996 | Henry .................................. 327/404 |
| 5,598,041 | 1/1997 | Willis ................................... 307/43 |
| 5,648,739 | 7/1997 | Walther et al. ..................... 327/436 |

Primary Examiner—Timothy P. Callahan
Assistant Examiner—Jeffrey Zweizig
Attorney, Agent, or Firm—Lane Aitken and McCann

[57] ABSTRACT

A MOSFET switched, redundant power supply has a back-to-back MOSFET switch connecting respectively each power supply to a single load. Each power supply has a positive and negative gate voltage source. In a specific N-channel MOSFET embodiment, the positive (i.e. on) bias is coupled to each switch via a radiation hardened, redundant analogue switch capable of being driven by, for example, a TTL or CMOS microprocessor signal. The negative (i.e. off) bias is coupled to each via a redundant diode pair. In addition, the gates of the back-to-back MOSFET switch for one power source are also connected to the negative bias of the other power source. In this way the MOSFET switch for a failed power supply will be maintained in an off state by the negative bias provided by the redundant supply.

14 Claims, 2 Drawing Sheets

5,796,274

FAULT TOLERANT MOSFET DRIVER

This invention was made with Government support under Contract A012 awarded by the Government. The Government has certain rights in this invention.

BACKGROUND OF THE INVENTION

1. Field of the Invention

This invention relates to a fault tolerant driver circuit that allows non-radiation hardened MOSFET's to be used in high radiation environments, and more particularly, to a fault tolerant driver circuit that ensures in a radiation environment the turn-off of MOSFET's used as switches to couple redundant power supplies to a load.

1. Description of the Prior Art

Uninterruptible power supplies commonly have two, redundant, d.c. power sources connected by solid state switches to a single load. If one of the power sources fails the load can be carried by the other power source. Proposals have been made to use MOSFET switches in such redundant power supply applications. Applicant's copending application Ser. No. 08/559,584, filed Nov. 16, 1995 and assigned to the assignee of this application, which is incorporated herein by reference, discloses the use of back-to-back connected MOSFET switches in a redundant power supply application. In this back-to-back configuration, the MOSFET switches provide isolation in the off state both between the power source and the load and the load and the power source. MOSFET switches are attractive for this application because, among other things, they have a very "low on" resistance, providing a small voltage drop across the MOSFET switch and a low power loss through the switch.

For use in high radiation environments, radiation hardened MOSFETs can be used. However, radiation hardened MOSFETs typically have an "on" resistance that is three times as high as a non-radiation hardened MOSFET for a given die/package size, and three times the cost.

A MOSFET functions as a switch between its source and drain when a proper voltage is applied to its gate. For applications requiring high current and medium voltage, for example, commercially available MOSFETs are of the N-channel, enhancement mode type. The enhancement mode MOSFET requires the gate to be more positive than the source by some voltage (threshold voltage) in order to open the channel between the source and drain (i.e. turn the switch on). The problem with using a non-radiation hardened MOSFET in a radiation environment, is that the threshold voltage is permanently shifted in a negative direction when the MOSFET is exposed to radiation. An N-channel MOSFET can change from an enhancement device to a depletion device with a 20K rad total dose. This means that a negative gate to source bias must be maintained in order to place and keep the MOSFET in a nonconducting state (i.e. off state). This off bias condition is difficult to maintain without introducing potential single points of circuit failure.

SUMMARY OF THE INVENTION

An object of this invention is the provision of a bipolar (i.e. positive and negative) gate drive circuit that minimizes fault propagation and provides a redundant architecture non-radiation hardened, MOSFET switched, redundant power supply used in a radiation environment.

Briefly, this invention contemplates the provision of a MOSFET switched, redundant power supply with a back-to-back MOSFET switch connecting respectively each power supply to a single load. Each power supply has a positive and negative gate voltage source. In a specific N-channel MOSFET embodiment, the positive (i.e. on) bias is coupled to each switch via a radiation hardened, redundant analogue switch capable of being driven by, for example a TTL or CMOS microprocessor signal. The negative (i.e. off) bias is coupled to each via a redundant diode pair. In addition, the gates of the back-to-back MOSFET switch for one power source are also connected to the negative bias of the other power source. In this way the MOSFET switch for a failed power supply will be maintained in an off state by the negative bias provided by the redundant supply.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
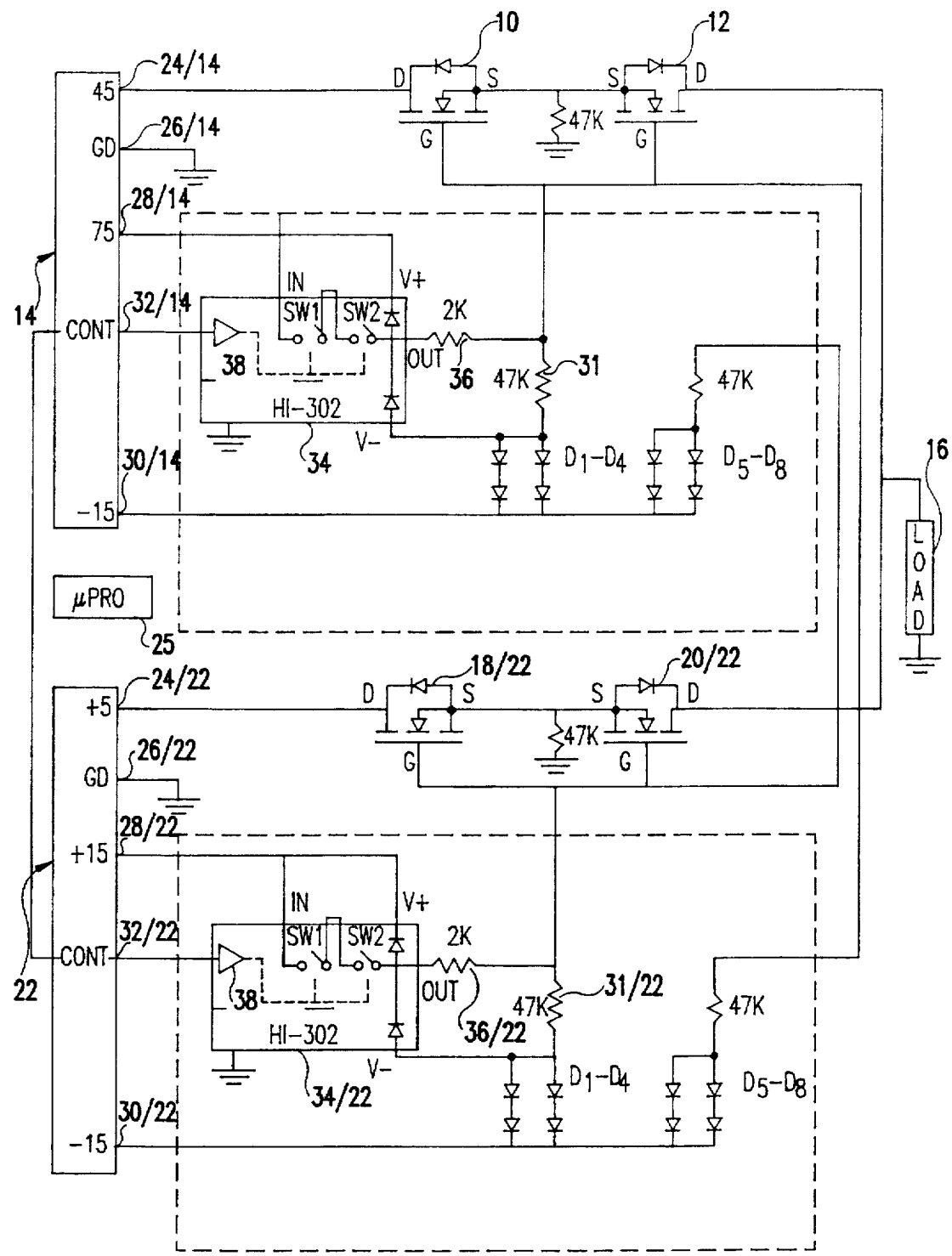
FIG. 1 is a schematic drawing of one embodiment of an N-channel MOSFET driver for redundant power supplies in accordance with the teachings of this invention.

Referring now to FIG. 1, a pair of back-to-back MOSFET switches 10 and 12 connect a power source 14 to a load 16. Another pair of back-to-back MOSFET switches 18 and 20 connect the load 16 to another power source 22. As will be appreciated by those skilled in the art, the power sources 14 and 22 in combination provide a redundant power source to the load 16. For example, if power source 14 fails, MOSFET switches 10 and 12 disconnect it from the load 16 and MOSFET switch 18 and 20 connect the load to the other power source 22. It will be further appreciated the back-to-back connection of the MOSFET pairs (i.e. source S to drain D) prevents both power source faults and load faults from propagating when the MOSFET switches are in an open state (i.e. non-conducting state).

The MOSFET switches 10–12 and 18–20 are N-channel depletion mode devices and are not radiation hardened, so that a negative bias must be applied to their respective gates "G" in order to maintain them in an off state (i.e. non-conducting state).

Each power source 14 and 22 has a load power terminal respectively 24/14 and 14/22 a ground terminal respectively 26/14 and 26/22 for supplying power to the load 16; a bipolar pair of gate bias terminals comprised of a positive bias terminal respectively 28/14 and 28/22 and a negative bias terminal respectively 30/14 and 30/22; and a control terminal, which provides different logic level commands from, for example, a microprocessor 25 to open and close the MOSFET switch pairs. Since the driver circuit for power source 14 is the same as the drive circuit for power source 22, only the circuit for source 14 will be explained in detail.

The load power terminal 24/14 is connected to the drain "D" of MOSFET 10 whose source "S" is connected to the source "S" of MOSFET 12. The drain "D" of MOSFET 12 is connected to the load 16. A radiation hardened switch 34 connects and disconnects the positive bias terminal 28/14 to the gates G of the MOSFETs 10 and 12 via a relative small resistor 36 (e.g. 2K). The switch 34 comprises two individual switches S1 and S2 which are connected in series to provide redundancy; that is, both S1 and S2 must close in order to connect the positive bias to the MOSFET gates. If either S1 or S2 fails to close or only one of them opens upon command, power source 14 is disconnected from the load 16. The output of an buffer/level-shifter 38, whose input is connected to the control terminal 32/14, opens and closes the switches S1 and S2 in response to the logic level command at terminal 32/14. The switch also includes two intrinsic diodes connected in series between a switch terminal V+, which is connected to the positive bias terminal 28/14, and a switch terminal V−, which is connected to the negative bias terminal 30/14 via redundant pairs of diodes D1–D4. Suitable radiation hardened analogue switches 34 are commercially available, for example, the dual DPST HS-302HR/883S available from Harris Corporation.

The redundant diode pairs D1–D4 connect the negative bias terminal 30/14 to the gates G of the MOSFET switches 10 and 12 via a relatively large resistor 31 (e.g. 47K) in order to maintain them in an off state even when the turn-on threshold of these MOSFET devices has shifted to a negative value due to exposure to radiation. Resistor 31 also serves to limit current if a MOSFET gate to source rupture fault should occur. Negative bias terminal 30/14 is also connected to the gates G of MOSFET switches 18 and 20 via redundant diode pairs D5–D8. Redundant diode pairs allow proper diode action in the event a single diode fails to open or is shorted. Should power source 22 fail, the bias 30/14 from supply 14 will maintain switches 18 and 20 in an off state. Similarly, the redundant diode pairs D5–D8 associated with power source 14, connect the bias 30 of source 22 to the gates G of the switches 10 and 12 in order to maintain these switches in an off state should the negative bias 30/14 of supply 14 fail. In operation, to connect the 14 side power supply to the load 16, a suitable logic level signal is applied to the analogue switch 34 from the 14 side control terminal 32/14, closing S1 and S2. This connects the positive bias terminal 28/14 to the gates of switches 10 and 12. The 22 side power source is connected to the load the same way. The 14 and 22 side may be connected singly to the load 16 or in parallel to the load 16, as desired. To disconnect the 14 or 22 side from the load 16, a logic level command on terminal 32/14 causes the switches S1 and S2 to open. In the high impedance state of the switch 34, the negative bias terminal 30/14 is connected to the gates of the MOSFET switches via the diode pair D1–D4.

With the 14 side powered and the 22 side unpowered, the 22 side power source is isolated form the load 16 by the negative bias applied to the gates of switches 18 and 20 from the 14 side negative bias terminal 30/14. Similarly, with the 22 side powered and the 14 side unpowered, the 14 side power source is isolated from the load 16 by the negative bias applied to the gates of switches 10 and 12 from the 22 side negative bias terminal 30/14. This supply side isolation keeps the 14-side supplied current from flowing through a failed shorted power supply on the 22side and vise versa. It should be noted that the V−terminal of the switch 34 is connected to diodes D1–D4 to prevent reverse substrate current from flowing when the 14 side is held in an off state from the 22 side, and vise versa. If the V−were connected to a disabled negative bias terminal 34/14, the MOSFET gate voltage would be clamped to one diode drop below ground potential, which is insufficient to insure the MOSFET is in an off state in the presence of radiation.

Figure 2:
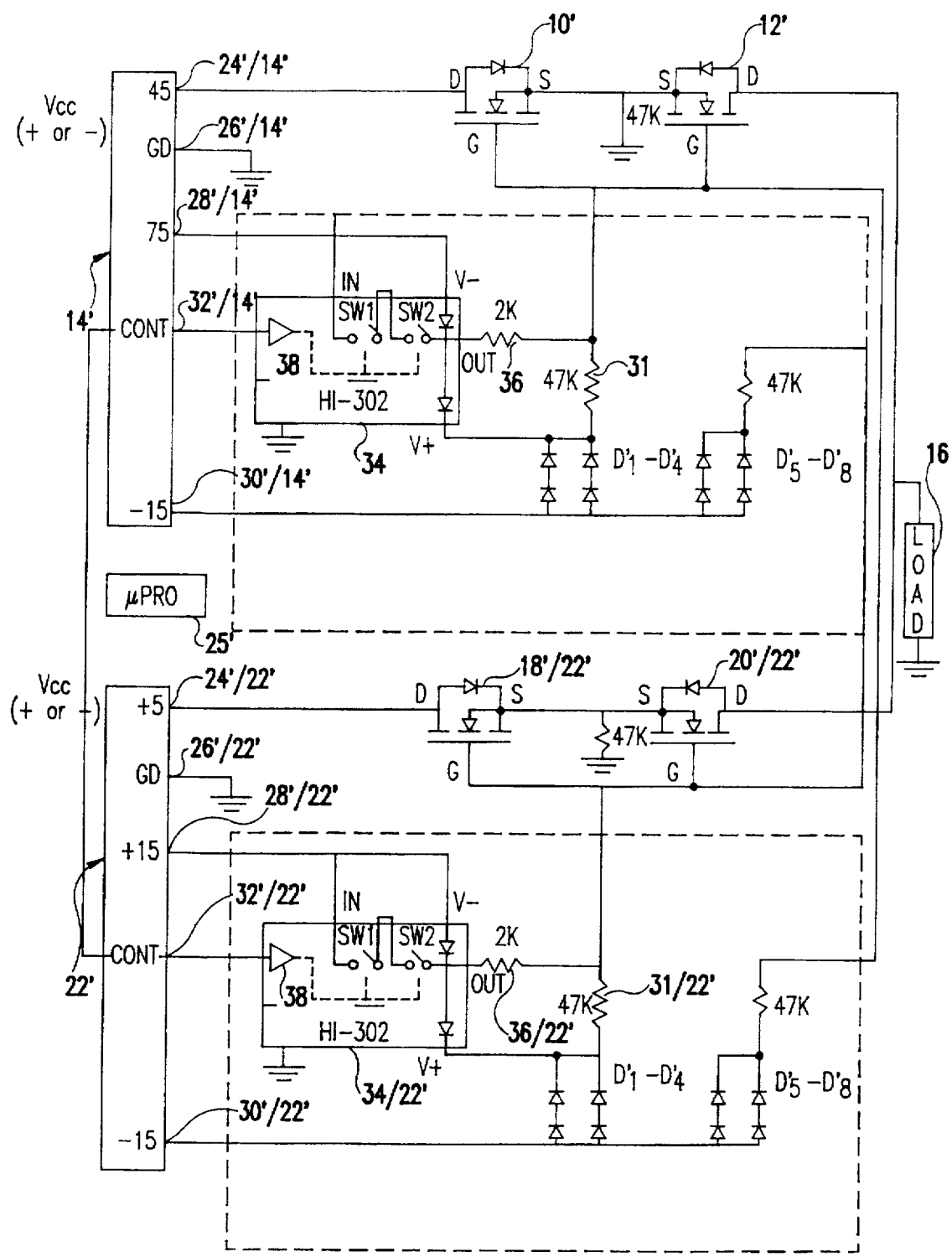
FIG. 2 is a schematic drawing similar to FIG. 1 for a P-channel version of the invention.

FIG. 2 shows the invention implemented to insure the proper control of P-channel MOSFETs. Since this driver circuit and its operation is substantially the same as that shown in FIG. 1 except changed polarities, its operation will be understood by those skilled without further explanation. However, it should be noted that P-channel MOSFETs do not behave the same as N-channel MOSFETs under radiation exposure. That is, N-channel MOSFETs are harder to turn off, whereas P-channel MOSFETs are harder to turn on. The reason is they both experience negative threshold shifting; an equivalent to the trapped charge in the gate oxide region creating a negative battery applied in series with the gate.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A fault tolerant MOSFET driver circuit for turning on and off MOSFET switches, which couple two or more redundant power sources to a load, comprising in combination:

a first power source including a positive bias means, a negative bias means, a load power means, and a first control signal source;

a second power source including a positive bias means, a negative bias means, a load power means, and a second control signal source;

a first MOSFET switch means having a source, a drain and a gate for connecting said load power means of said first power source to said load;

a second MOSFET switch means having a source, a drain and a gate for connecting said second power source to said load;

means responsive to said first control signal source for connecting said positive bias means of said first power source to said gate of said first MOSFET switch;

means for coupling said gate of said first MOSFET switch to said negative bias means of said first power source;

means for coupling said gate of said first MOSFET switch to said negative bias means of said second power source;

means responsive to said second control signal source for connecting said positive bias means of said second power source to said gate of said second MOSFET switch;

means for coupling said gate of said second MOSFET switch to said negative bias means of said second power source; and means for coupling said gate of said second MOSFET switch to said negative bias means of said first power source.

2. A fault tolerant MOSFET driver circuit for turning on and off MOSFET switches, which couple two or more redundant power sources to a load as in claim 1 wherein said MOSFET switches are not radiation hardened.

3. A fault tolerant MOSFET driver circuit for turning on and off MOSFET switches, which couple two or more redundant power sources to a load as in claim 1 wherein said MOSFET switches are N-channel of, enhancement mode devices.

4. A fault tolerant MOSFET driver circuit for turning on and off MOSFET switches, which couple two or more redundant power sources to a load as in claim 1 wherein said means responsive to said control signal source is a radiation hardened switch.

5. A fault tolerant MOSFET driver circuit for turning on and off MOSFET switches, which couple two or more redundant power sources to a load as in claim 1 wherein said means for coupling said gate of said first MOSFET switch to said negative bias means of said first power source includes a redundant diode pair.

6. A fault tolerant MOSFET driver circuit for turning on and off MOSFET switches, which couple two or more redundant power sources to a load as in claim 1 wherein said means for coupling said gate of said first MOSFET switch to said negative bias means of said second power source includes a redundant diode pair.

7. A fault tolerant MOSFET driver circuit for turning on and off MOSFET switches, which couple two or more redundant power sources to a load as in claim 6 wherein said means for coupling said gate of said first MOSFET switch to said negative bias means of said second power source includes a redundant diode pair.

8. A fault tolerant MOSFET driver circuit for turning on and off MOSFET switches, which couple two or more redundant power sources to a load, comprising in combination:

a first power source including a positive bias means, a negative bias means, a load power means, and a first control signal source;

a second power source including a positive bias means, a negative bias means, a load power means, and a second control signal source;

a first MOSFET switch means having a source, a drain and a gate for connecting said load power means of said first power source to said load;

a second MOSFET switch means having a source, a drain and a gate for connecting said second power source to said load;

means responsive to said first control signal source for connecting said negative bias means of said first power source to said gate of said first MOSFET switch;

means for coupling said gate of said first MOSFET switch to said positive bias means of said first power source;

means for coupling said gate of said first MOSFET switch to said positive bias means of said second power source;

means responsive to said second control signal source for connecting said negative bias means of said second power source to said gate of said second MOSFET switch;

means for coupling said gate of said second MOSFET switch to said positive bias means of said second power source; and means for coupling said gate of said second MOSFET switch to said positive bias means of said first power source.

9. A fault tolerant MOSFET driver circuit for turning on and off MOSFET switches, which couple two or more redundant power sources to a load as in claim 8 wherein said MOSFET switches are not radiation hardened.

10. A fault tolerant MOSFET driver circuit for turning on and off MOSFET switches, which couple two or more redundant power sources to a load as in claim 8 wherein said MOSFET switches are N-channel of, enhancement mode devices.

11. A fault tolerant MOSFET driver circuit for turning on and off MOSFET switches, which couple two or more redundant power sources to a load as in claim 8 wherein said means responsive to said control signal source is a radiation hardened switch.

12. A fault tolerant MOSFET driver circuit for turning on and off MOSFET switches, which couple two or more redundant power sources to a load as in claim 8 wherein said means for coupling said gate of said first MOSFET switch to said negative bias means of said first power source includes a redundant diode pair.

13. A fault tolerant MOSFET driver circuit for turning on and off MOSFET switches, which couple two or more redundant power sources to a load as in claim 8 wherein said means for coupling said gate of said first MOSFET switch to said negative bias means of said second power source includes a redundant diode pair.

14. A fault tolerant MOSFET driver circuit for turning on and off MOSFET switches, which couple two or more redundant power sources to a load as in claim 13 wherein said means for coupling said gate of said first MOSFET switch to said negative bias means of said second power source includes a redundant diode pair.

* * * * *